United States Patent
Seo

(10) Patent No.: US 8,345,493 B2
(45) Date of Patent: Jan. 1, 2013

(54) SEMICONDUCTOR MEMORY DEVICE

(75) Inventor: Ju-Young Seo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 144 days.

(21) Appl. No.: 12/833,851

(22) Filed: Jul. 9, 2010

(65) Prior Publication Data

US 2011/0292747 A1 Dec. 1, 2011

(30) Foreign Application Priority Data

May 31, 2010 (KR) .................. 10-2010-0051206

(51) Int. Cl.
*G11C 29/24* (2006.01)
(52) U.S. Cl. .................. 365/200; 365/230.04
(58) Field of Classification Search .......... 365/201, 365/200, 225.7, 230.04, 230.03, 190
See application file for complete search history.

(56) References Cited

U.S. PATENT DOCUMENTS

| | | | | |
|---|---|---|---|---|
| 4,656,610 | A * | 4/1987 | Yoshida et al. | 365/189.07 |
| 5,812,468 | A * | 9/1998 | Shirley | 365/200 |
| 5,912,579 | A * | 6/1999 | Zagar et al. | 327/526 |
| 6,608,772 | B2 * | 8/2003 | Ooishi | 365/63 |

FOREIGN PATENT DOCUMENTS

| | | |
|---|---|---|
| KR | 1020010059018 | 7/2001 |
| KR | 1020060070032 | 6/2006 |
| KR | 1020080019271 | 3/2008 |

OTHER PUBLICATIONS

Notice of Allowance issued from Korean Intellectual Property Office on Jul. 12, 2011.

* cited by examiner

*Primary Examiner* — Douglas King
(74) *Attorney, Agent, or Firm* — IP & T Group LLP

(57) ABSTRACT

In a semiconductor memory device which performs a repair method of replacing a repair target word line and one adjacent word line at the same time by a repair operation through an efficient decoding operation for selecting a repair target address, a test operation of enabling only a word line corresponding to a cell coupled to a bit line or a bit line bar is stably performed.

8 Claims, 4 Drawing Sheets

SEMICONDUCTOR MEMORY DEVICE

CROSS-REFERENCE TO RELATED APPLICATIONS

The present application claims priority of Korean Patent Application No. 10-2010-0051206, filed on May 31, 2010, which is incorporated herein by reference in its entirety.

BACKGROUND OF THE INVENTION

Exemplary embodiments of the present invention relate to a semiconductor design technology, and more particularly, to a redundancy operation of a semiconductor memory device.

A semiconductor device may operate abnormally when defects occur in some memory cells of the semiconductor device. In order to address this concern, extra memory cells are made in advance and used to replace cells which are detected as failed cells through a test. In this case, the extra memory cells are referred to as spare cells, and a circuit involved in the replacement operation is referred to as a redundancy circuit.

A failed memory cell is detected through a test and a programming operation which changes an address corresponding to the failed memory cell to an address of a spare cell is performed in an internal circuit. Accordingly, it is necessary to perform an operation of determining whether a normal address inputted during an actual operation of a semiconductor device is an address corresponding to a failed memory cell line.

That is, when it is determined that the inputted normal address is the address corresponding to the failed line, a redundancy line corresponding to a spare cell is selected, instead of the failed line corresponding to the normal address. On the other hand, when it is determined that the inputted normal address is not the address corresponding to the failed line, a normal line corresponding to the normal address is selected.

In this case, a fuse set is generally used to determine whether the inputted normal address is the address corresponding to the failed line. That is, the fuse set is previously set such that it corresponds to the address of the failed line, and it is determined whether the normal address is the address corresponding to the failed line by applying the normal address to the fuse set.

FIG. 1 is a block diagram of a circuit for performing a redundancy operation in a conventional semiconductor memory device.

Referring to FIG. 1, cell arrays provided in the conventional semiconductor memory device may be classified as follows.

A normal cell array is classified into a first normal cell array 10 and a second normal cell array 12. The first normal cell array 10 includes normal cells corresponding to normal odd word lines SWL1 and SWL5 and bit lines BL0 and BL1, and normal cells corresponding to normal even word lines SWL0 and SWL4 and bit lines bar BLB0 and BLB1. The second normal cell array 12 includes normal cells corresponding to normal odd word lines SWL3 and SWL7 and bit lines bar BLB0 and BLB1, and normal cells corresponding to normal even word lines SWL2 and SWL6 and bit lines BL0 and BL1.

Likewise, a redundancy cell array is classified into a first redundancy cell array 14 and a second redundancy cell array 16. The first redundancy cell array 14 includes redundancy cells corresponding to redundancy odd word lines RSWL1 and RSWL5 and bit lines BL0 and BL1, and redundancy cells corresponding to redundancy even word lines RSWL0 and RSWL4 and bit lines bar BLB0 and BLB1. The second redundancy cell array 16 includes redundancy cells corresponding to redundancy odd word lines RSWL3 and RSWL7 and bit lines bar BLB0 and BLB1, and redundancy cells corresponding to redundancy even word lines RSWL2 and RSWL6 and bit lines BL0 and BL1.

Since the normal cell array is classified into the first normal cell array 10 and the second normal cell array 12 and the redundancy cell array is classified into the first redundancy cell array 14 and the second redundancy cell array 16, a repair target word line and one word line adjacent to the repair target word line can be replaced with corresponding redundancy word lines at the same time. Therefore, a repair operation can be performed through an efficient decoding operation for selecting a repair target address.

For example, when a fail occurs in the third normal odd word line SWL3 among the normal odd word lines SWL1, SWL3, SWL5 and SWL7 included in the normal cell array and thus it becomes a repair target word line, the third normal odd word line SWL3 and the fourth word even line SWL4 may be replaced with the redundancy word lines included in the redundancy cell array at the same time, even though the fourth normal even word line SWL4 is in a normal state.

The above-described method in which the normal word line adjacent to the repair target word line is also replaced in order to perform the repair operation through the efficient decoding operation for selecting the repair target address can be performed without any concern in a normal mode operation of the semiconductor memory device.

However, the above-described method may cause a following concern in a test mode operation.

At the test mode operation, the normal word lines SWL1, SWL2, SWL5 and SWL6 corresponding to the cells coupled to the bit lines BL0 and BL1 of the normal cell array 10 or the normal word lines SWL0, SWL3, SWL4 and SWL7 corresponding to the cells coupled to the bit lines bar BLB0 and BLB1 of the normal cell array 10 are only enabled.

In such a test operation, in case where a fail occurs in the word line included in the first normal cell array 10 but a repair operation is performed using the word line included in the second redundancy cell array 16, a test repair operation may be abnormally performed.

That is, in the first normal cell array 10, the cells are formed by the coupling between the normal odd word lines SWL1 and SWL5 and the bit lines BL0 and BL1 or the coupling between the normal even word lines SWL0 and SWL4 and the bit lines bar BLB0 and BLB1. On the other hand, in the second redundancy cell array 16, the cells are formed by the coupling between the redundancy odd word lines RSWL3 and RSWL7 and the bit lines bar BLB0 and BLB1 or the coupling between the redundancy even word lines RSWL2 and RSWL6 and the bit lines BL0 and BL1. Therefore, in case where a fail occurs in the word line included in the first normal cell array 10 but a repair operation is performed using the word line included in the second redundancy cell array 16, the cells coupled to the normal odd word lines SWL1 and SWL5 and the normal even word lines SWL0 and SWL4 of the first normal cell array 10 and the cells coupled to the redundancy odd word lines RSWL3 and RSWL7 and the redundancy even word lines RSWL2 and RSWL6 of the second redundancy cell array 16 are matched with respect to the bit lines BL0 and BL1 and the bit lines bar BLB0 and BLB1 opposite to one another. Thus, the test repair operation may be abnormally performed.

For example, when a fail occurs in the zeroth normal word line SWL0 among the normal word lines SWL0, SWL1, SWL4 and SWL5 included in the first normal cell array 10 and thus it becomes a repair target word line, the first normal word line SWL1 among the normal word lines SWL0, SWL1, SWL4 and SWL5 included in the first normal cell array 10 is to be replaced since one word line adjacent to the repair target word line is also replaced. At this time, if the repair operation is performed using the redundancy word lines RSWL2, RSWL3, RSWL6, and RSWL7, the redundancy word line corresponding to the zeroth normal word line SWL0 is the second redundancy word line RSWL2 or the sixth redundancy word line RSWL6.

In this case, while the zeroth normal word line SWL0 included in the first normal cell array 10 is coupled to the cell in correspondence to the bit lines bar BLB0 and BLB1, the second redundancy word line RSWL2 or the sixth redundancy word line RSWL6 included in the second redundancy cell array 16 is coupled to the cell in correspondence to the bit lines BL0 and BL1. Thus, the cells are matched with respect to the bit lines BL0 and BL1 and the bit lines bar BLB0 and BLB1 opposite to one another.

When the above-described test operation is performed, the first normal word line SWL1 corresponding to the cells coupled to the bit lines BL0 and BL1 may be replaced with the third redundancy word line RSWL3 corresponding to the cells coupled to the bit lines bar BLB0 and BLB1, and the zeroth normal word line SWL0 corresponding to the cells coupled to the bit lines bar BLB0 and BLB1 may be replaced with the second redundancy word line RSWL2 corresponding to the cells coupled to the bit lines BL0 and BL1. Thus, the test fails because the redundancy word lines is not enabled through the test operation.

Therefore, in the prior art, when the method of replacing the repair target word line and the adjacent word line at the same time in order to perform the repair operation through the efficient decoding operation for selecting the repair target address is applied to the above-described test operation, the first normal cell array 10 is controlled such that the repair operation is performed with only the first redundancy cell array 14, and the second normal cell array 12 is controlled such that the repair operation is performed with only the second redundancy cell array 16. However, it is inefficient because the target range of the repair operation is reduced by half for the test operation.

SUMMARY OF THE INVENTION

An exemplary embodiment of the present invention is directed to a semiconductor memory device which is capable of stably performing a test operation of enabling a word line corresponding to a cell coupled to one of a bit line and a bit line bar. The semiconductor memory device performs a repair operation through an efficient decoding operation for selecting a repair target address by replacing a repair target word line and one adjacent word line at the same time.

In accordance with an exemplary embodiment of the present invention, a semiconductor memory device includes a first normal cell array including normal cells corresponding to odd word lines and bit lines and normal cells corresponding to even word lines and bit lines bar, a second normal cell array including normal cells corresponding to the odd word lines and the bit lines bar and normal cells corresponding to the even word lines and the bit lines, a first redundancy cell array including redundancy cells corresponding to the odd word lines and the bit lines and redundancy cells corresponding to the even word lines and the bit lines bar, a second redundancy cell array including redundancy cells corresponding to the odd word lines and the bit lines bar and redundancy cells corresponding to the even word lines and the bit lines, a repair detection unit configured to detect a repair operation of the second normal cell array through the first redundancy cell array or a repair operation of the first normal cell array through the second redundancy cell array, and a repair inversion unit configured to selectively change a matching of the odd and even word lines of the first and second normal cell arrays with the odd and even word lines of the first and second redundancy cell arrays in response to an output signal of the repair detection signal.

In accordance with another exemplary embodiment of the present invention, a semiconductor memory device includes a first normal cell array comprising normal cells corresponding to odd word lines and bit lines and normal cells corresponding to even word lines and bit lines bar, a second normal cell array comprising normal cells corresponding to the odd word lines and the bit lines bar and normal cells corresponding to the even word lines and the bit lines, a first redundancy cell array comprising redundancy cells corresponding to the odd word lines and the bit lines and redundancy cells corresponding to the even word lines and the bit lines bar, a second redundancy cell array comprising redundancy cells corresponding to the odd word lines and the bit lines bar and redundancy cells corresponding to the even word lines and the bit lines, a repair operation unit configured to program a row address of a repair target word line and output a repair detection signal depending on a programmed value, and a repair inversion unit configured to selectively change a matching of the odd and even word lines of the first and second normal cell arrays with the odd and even word lines of the first and second redundancy cell arrays in response to the repair detection signal.

DESCRIPTION OF SPECIFIC EMBODIMENTS

Figure 1:
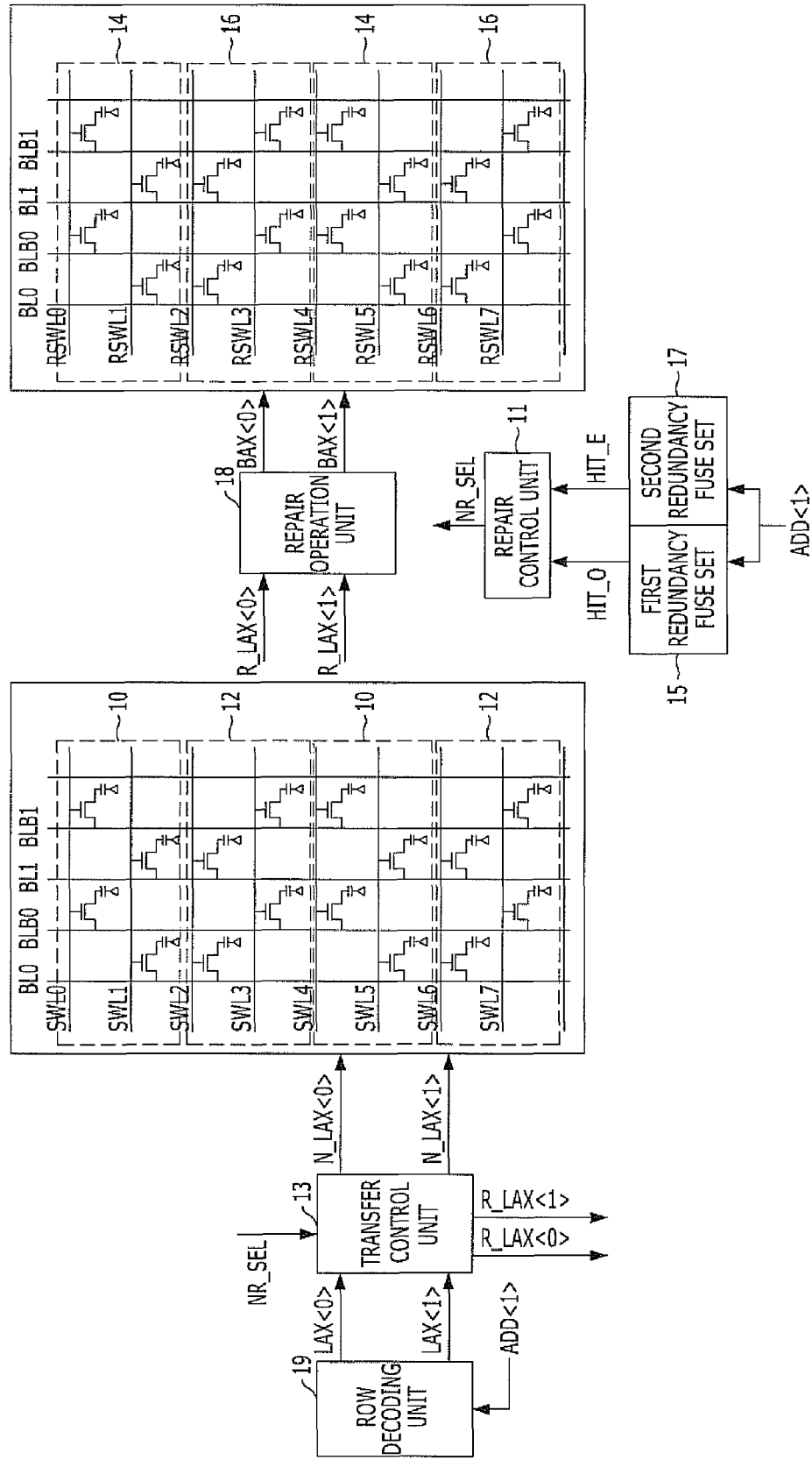
FIG. 1 is a block diagram of a circuit for performing a redundancy operation in a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
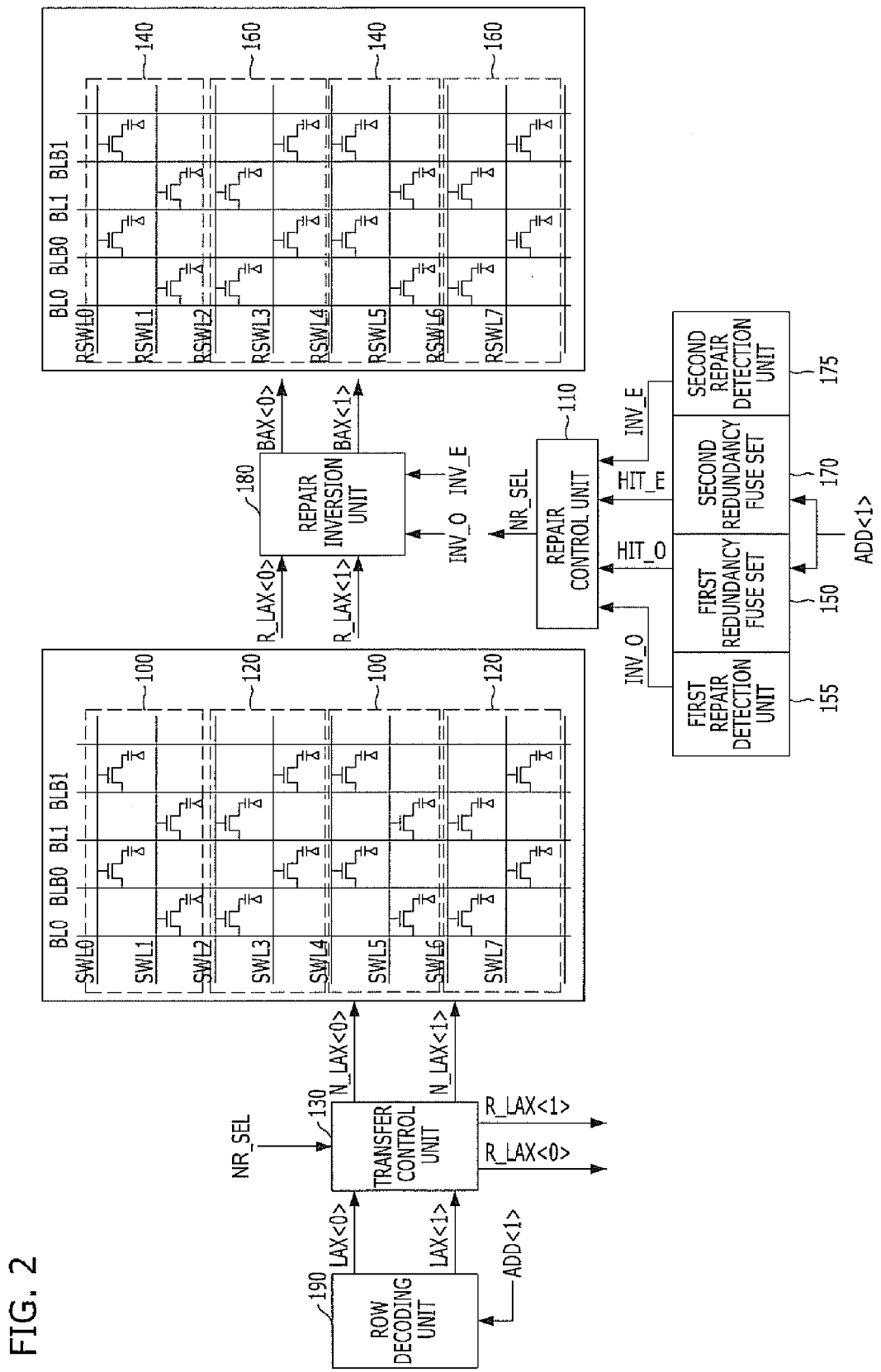
FIG. 2 is a block diagram of a circuit for performing a redundancy operation in a semiconductor memory device in accordance with an exemplary embodiment of the present invention.

FIG. 2 is a block diagram of a circuit for performing a redundancy operation in a semiconductor memory device in accordance with an exemplary embodiment of the present invention.

Referring to FIG. 2, cell arrays provided in the semiconductor memory device in accordance with the embodiment of the present invention may be classified as follows.

A normal cell array is classified into a first normal cell array 100 and a second normal cell array 120. The first normal cell array 100 includes normal cells corresponding to normal odd word lines SWL1 and SWL5 and bit lines BL0 and BL1, and normal cells corresponding to normal even word lines SWL0 and SWL4 and bit lines bar BLB0 and BLB1. The second normal cell array 120 includes normal cells corresponding to normal odd word lines SWL3 and SWL7 and bit lines bar BLB0 and BLB1, and normal cells corresponding to normal even word lines SWL2 and SWL6 and bit lines BL0 and BL1.

Likewise, a redundancy cell array is classified into a first redundancy cell array 140 and a second redundancy cell array 160. The first redundancy cell array 140 includes redundancy cells corresponding to redundancy odd word lines RSWL1 and RSWL5 and bit lines BL0 and BL1, and redundancy cells corresponding to redundancy even word lines RSWL0 and RSWL4 and bit lines bar BLB0 and BLB1. The second redundancy cell array 160 includes redundancy cells corresponding to redundancy odd word lines RSWL3 and RSWL7 and bit lines bar BLB0 and BLB1, and redundancy cells corresponding to redundancy even word lines RSWL2 and RSWL6 and bit lines BL0 and BL1.

The semiconductor memory device in accordance with the embodiment of the present invention includes repair detection units 155 and 175 and a repair inversion unit 180. The repair detection units 155 and 175 are configured to detect a case where the second normal cell array 120 is repaired through the first redundancy cell array 140, or the first normal cell array 100 is repaired through the second redundancy cell array 160. The repair inversion unit 180 is configured to selectively change a matching of and repair the odd word lines SWL1, 3, 5, 7 and the even word lines SWL0, 2, 4, 6 of the first and second normal cell arrays 100 and 120 with the odd word lines RSWL1, 3, 5, 7 the even word lines RSWL0, 2, 4, 6 the first and second redundancy cell arrays 140 and 160, in response to output signals INV_O and INV_E of the repair detection units 155 and 175.

Also, the semiconductor memory device in accordance with the embodiment of the present invention further includes a first redundancy fuse set 150 and a second redundancy fuse set 170. The first redundancy fuse set 150 is configured to correspond to the first redundancy cell array 140 and program a row address ADD<1> of a repair target word line included in the first normal cell array 100 or the second normal cell array 120. The second redundancy fuse set 170 is configured to correspond to the second redundancy cell array 160 and program a row address ADD<1> of a repair target word line included in the first normal cell array 100 or the second normal cell array 120.

Also, the semiconductor memory device in accordance with the embodiment of the present invention further includes a row decoding unit 190, a repair control unit 110, and a transfer control unit 130. The row decoding unit 190 is configured to decode the row address ADD<1> and select a word line, through which data is inputted/outputted, among the plurality of word lines SWL0-7 and RSWL0-7. The repair control unit 110 is configured to generate a signal NR_SEL for controlling the transfer control unit 130 according to whether the applied row address ADD<1> is a repair target address or not. The transfer control unit 130 is configured to transfer signals LAX<0> and LAX<1> from the row decoding unit 190 to the redundancy cell arrays 140 and 160 (R_LAX<0> and R_LAX<1>) when the applied row address ADD<1> is the repair target address, and to transfer the signals LAX<0> and LAX<1> from the row decoding unit 190 to the normal cell arrays 100 and 120 (N_LAX<0> and N_LAX<1>) when the applied row address ADD<1> is not the repair target address.

A first repair detection unit 155 of the repair detection units generates a first repair detection signal INV_O which is activated when the repair target word line corresponding to the first redundancy cell array 140 is included in the second normal cell array 120 and is deactivated when the repair target word line is included in the first normal cell array 100. A second repair detection unit 175 of the repair detection units generates a second repair detection signal INV_E which is activated when the repair target word line corresponding to the second redundancy cell array 160 is included in the first normal cell array 100 and is deactivated when the repair target word line is included in the second normal cell array 120.

In addition, the repair inversion unit 180 performs a control operation so that the odd word lines SWL3 and SWL7 and the even word lines SWL2 and SWL6 of the second normal cell array 120 are repaired with the even word lines RSWL0 and RSWL4 and the odd word lines RSWL1 and RSWL5 and of the first redundancy cell array 140, respectively, in response to the activation of the first repair detection signal INV_O. The repair inversion unit 180 performs a control operation so that the odd word lines SWL1 and SWL5 and the even word lines SWL0 and SWL4 of the first normal cell array 100 are repaired with the odd word lines RSWL1 and RSWL5 and the even word lines RSWL0 and RSWL4 of the first redundancy cell array 140 in response to the deactivation of the first repair detection signal INV_O. The repair inversion unit 180 performs a control operation so that the odd word lines SWL1 and SWL5 and the even word lines SWL0 and SWL4 of the first normal cell array 100 are repaired with the even word lines RSWL2 and RSWL6 and the odd word lines RSWL3 and RSWL7 and of the second redundancy cell array 160, respectively, in response to the activation of the second repair detection signal INV_E. Also, the repair inversion unit 180 performs a control operation so that the odd word lines SWL3 and SWL7 and the even word lines SWL2 and SWL6 of the second normal cell array 120 are repaired with the odd word lines RSWL3 and RSWL7 and the even word lines RSWL2 and RSWL6 of the second redundancy cell array 160 in response to the deactivation of the second repair detection signal INV_E.

In the normal cell arrays 100 and 120 and the redundancy cell arrays 140 and 160 illustrated in FIG. 2, only the regions of cells which can be selected by the lowermost three bits ADD<0:2> of the multi-bit row address ADD<0:N> are described. In practice, the normal cell arrays and the redundancy cell arrays are included and integrated as many as a set multiple to form a core region.

In the embodiment of the present invention, the second bit ADD<2> of the multi-bit row address ADD<0:N> is a value which determines whether to select the zeroth to third word lines SWL0-3 or the fourth to seventh word lines SWL4-7 among the plurality of word lines SWL0-7 provided in the normal cell arrays 100 and 120.

Therefore, the first bit ADD<1> of the multi-bit row address ADD<0:N> is a value which determines whether to select the zeroth and first word lines SWL0 and SWL1, or the second and third word lines SWL2 and SWL3 among the word lines SWL0-3, or the fourth and fifth word lines SWL4 and SWL5, or the sixth and seventh word lines SWL6 and SWL7 among the word lines SWL4-7, provided in the normal cell arrays 100 and 120.

Likewise, the zeroth bit ADD<0> of the multi-bit row address ADD<0:N> is a value which determines the selection of one of the plurality of word lines SWL0-7, provided in the normal cell arrays 100 and 120.

The purpose of the lowermost three bits ADD<0:2> of the multi-bit row address ADD<0:N> is described above. In the repair method of replacing the repair target word line and the adjacent word line at the same time, the repair operation may be changed according to the value of the first bit ADD<1> of the multi-bit row address ADD<0:N>.

That is, when the first bit ADD<1> of the multi-bit row address ADD<0:N> is at a logic low level, it may be an address for selecting the first normal cell array 100. On the contrary, when the first bit ADD<1> of the multi-bit row address ADD<0:N> is at a logic high level, it may be an address for selecting the second normal cell array 120.

The redundancy fuse sets 150 and 170 are matched in two units RSWL0, RSWL1/RSWL2, RSWL3/RSWL4, RSWL5/RSWL6, RSWL7 of the plurality of word lines RSWL0-7 included in the redundancy cell arrays 140 and 160, with respect to the first bit ADD<1> of the row address ADD<0:N>. Thus, the repair detection units 155 and 175 can detect whether the repair target word line belongs to the first normal cell array 100 or the second normal cell array 120 according to the value of the first bit ADD<1> of the multi-bit row address ADD<0:N>. Also, the repair detection units 155 and 175 can detect whether the repair target word line belonging to the first or second normal cell array 100 or 120 is replaced with the word line belonging to the first redundancy cell array 140 or the word line belonging to the second redundancy cell array 160.

Meanwhile, only the address bit of the multi-bit row address, i.e., the first bit ADD<1>, usually used in this embodiment is described in FIG. 2 for illustration purposes.

Figure 3:
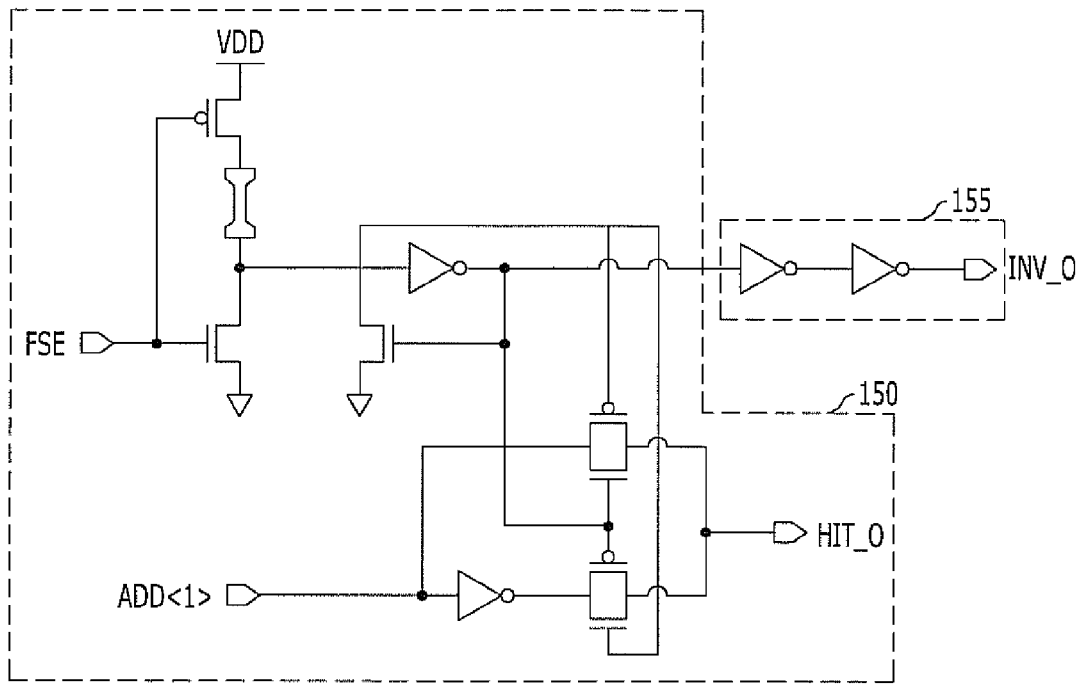
FIG. 3 is a detailed circuit diagram of a first redundancy fuse set and a first repair detection unit of FIG. 2 in accordance with the embodiment of the present invention.

FIG. 3 is a detailed circuit diagram of the first redundancy fuse set 150 and the first repair detection unit 155 of FIG. 2 in accordance with the embodiment of the present invention.

Referring to FIG. 3, the first redundancy fuse set 150 in accordance with the embodiment of the present invention performs an operation of setting an output signal HIT_O to a logic high level when the row address ADD<1> corresponding to the repair target cell array is inputted.

That is, when the row address ADD<1> corresponding to the repair target cell array is at a logic low level, the fuse is maintained to be uncut and the logic level of the row address ADD<1> is inverted to be outputted. Thus, the output signal HIT_O is set to a logic high level when the logic low level of row address ADD<1> is inputted. At this time, since the fuse is in an uncut state, the first repair detection signal INV_O becomes a logic low level.

Likewise, when the row address ADD<1> corresponding to the repair target cell array is at a logic high level, the fuse is cut and the logic level of the row address ADD<1> is outputted as it is. Thus, the output signal HIT_O is set to a logic high level when the logic high level of row address ADD<1> is inputted. At this time, since the fuse is in a cut state, the first repair detection signal INV_O becomes a logic high level.

As such, the first repair detection signal INV_O has an opposite logic level according to the logic level of the row address ADD<1> corresponding to the repair target cell array. At this time, the row address ADD<1> corresponding to the repair target cell array may be at a logic low level when the repair target word line belongs to the first normal cell array 100, and may be at a logic high level when the repair target word line belongs to the second normal cell array 120. Therefore, where the repair target word line belongs to can be easily known from the first repair detection signal INV_O.

Figure 4:
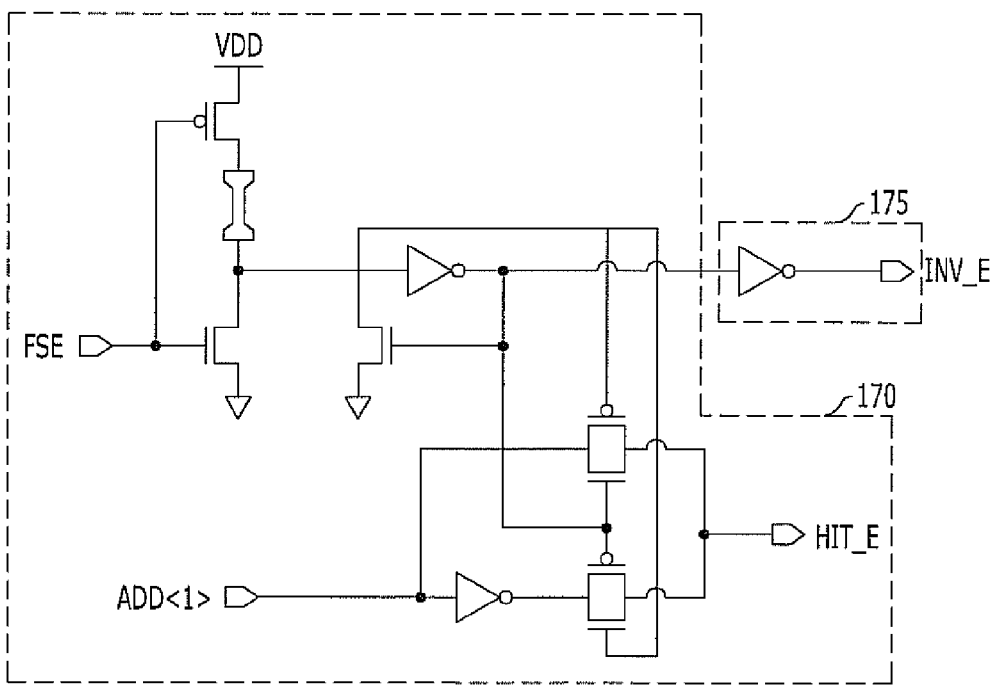
FIG. 4 is a detailed circuit diagram of a second redundancy fuse set and a second repair detection unit of FIG. 2 in accordance with the embodiment of the present invention.

FIG. 4 is a detailed circuit diagram of the second redundancy fuse set 170 and the second repair detection unit 175 of FIG. 2 in accordance with the embodiment of the present invention.

Referring to FIG. 4, the second redundancy fuse set 170 in accordance with the embodiment of the present invention performs an operation of setting an output signal HIT_E to a logic high level when the row address ADD<1> corresponding to the repair target cell array is inputted.

That is, when the row address ADD<1> corresponding to the repair target cell array is at a logic low level, the fuse remains uncut and the logic level of the row address ADD<1> is inverted to outputted. Thus, the output signal HIT_E is set to a logic high level when the logic low level of row address ADD<1> is inputted. At this time, since the fuse is in an uncut state, the second repair detection signal INV_E becomes a logic high level.

Likewise, when the row address ADD<1> corresponding to the repair target cell array is at a logic high level, the fuse is cut and the logic level of the row address ADD<1> is outputted as it is. Thus, the output signal HIT_E is set to a logic high level when the logic high level of row address ADD<1> is inputted. At this time, since the fuse is in a cut state, the second repair detection signal INV_E becomes a logic low level.

As such, the second repair detection signal INV_E has an opposite logic level according to the logic level of the row address ADD<1> corresponding to the repair target cell array. At this time, the row address ADD<1> corresponding to the repair target cell array may be at a logic low level when the repair target word line belongs to the first normal cell array 100, and may be at a logic high level when the repair target word line belongs to the second normal cell array 120. Therefore, where the repair target word line belongs to can be easily known from the second repair detection signal INV_E.

Figure 5:
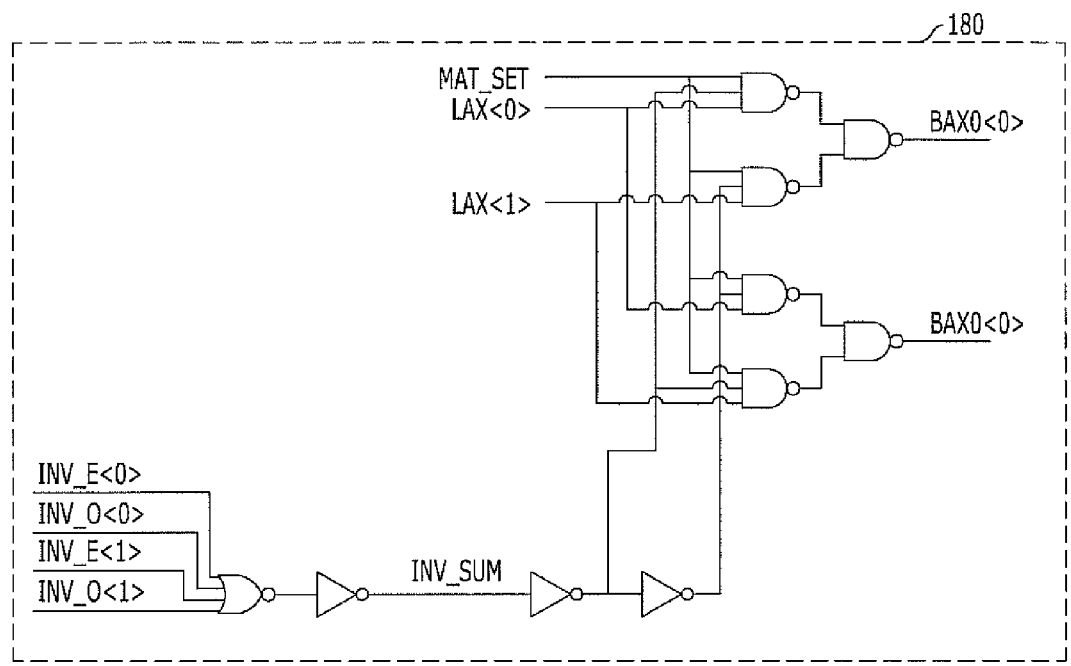
FIG. 5 is a detailed circuit diagram of a repair inversion unit of FIG. 2 in accordance with the embodiment of the present invention.

FIG. 5 is a detailed circuit diagram of the repair inversion unit 180 of FIG. 2 in accordance with the embodiment of the present invention.

Referring to FIG. 5, when any one of the output signals INV_E<0>, INV_E<1>, INV_O<0> and INV_O<1> of the repair detection units 155 and 175 is activated to a logic high level, the repair inversion unit 180 outputs a zeroth repair target selection signal R_LAX<0>, which is transferred from the row decoding unit 190 and is to select the repair target word line, as a first redundancy selection signal BAX<1>, which is to select the redundancy word line, and outputs a first repair target selection signal R_LAX<1>, which is to select the repair target word line, as a zeroth redundancy selection signal BAX<0>, which is to select the redundancy word line.

The matching of the repair target selection signals R_LAX<0> and R_LAX<1> to select the repair target word lines and the redundancy selection signals BAX<0> and BAX<1> to select the redundancy word lines, respectively, changes to match to different redundancy word lines when any one of the output signals INV_E<0>, INV_E<1>, INV_O<0> and INV_O<1> of the repair detection units 155 and 175 is activated to a logic high level. For example, when the zeroth and first normal word lines SWL0 and SWL1 are matched with the second and third redundancy word lines RSWL2 and RSWL3 for the repair operation, the selection signal corresponding to the zeroth normal word line SWL0 is outputted as a selection signal to select the third redundancy word line RSWL3 through the repair operation, and the selection signal corresponding to the first normal word line SWL1 is outputted as a selection signal to select the second redundancy word line RSWL2 through the repair operation.

In this manner, the normal repair operation may be achieved even though the word lines matched with each other for the repair operation, that is, the zeroth and first normal word lines SWL0 and SWL1 and the second and third redundancy word lines RSWL2 and RSWL3, are coupled to cells with respect to different bit lines BL0 and BL1 and bit lines bar BLB0 and BLB1.

On the other hand, when all the output signals INV_E<0>, INV_E<1>, INV_O<0> and INV_O<1> of the repair detection units 155 and 175 are deactivated to a logic low level, the repair inversion unit 180 outputs the zeroth repair target selection signal R_LAX<0>, which is transferred from the row decoding unit 190 and is to select the repair target word line, as the zeroth redundancy selection signal BAX<0>, which is to select the redundancy word line, and outputs the first repair target selection signal R_LAX<1>, which is to select the repair target word line, as the first redundancy selection signal BAX<1>, which is to select the redundancy word line.

As such, when all the output signals INV_E<0>, INV_E<1>, INV_O<0> and INV_O<1> of the repair detection units 155 and 175 are deactivated to a logic low level, the repair target selection signals R_LAX<0> and R_LAX<1> to select the repair target word lines are matched with the redundancy selection signals BAX<0> and BAX<1> to select the redundancy word lines, respectively. Thus, the repair operation is achieved.

For reference, while it is illustrated in FIG. 3 that the repair detection units 155 and 175 output two signals INV_E and INV_O, it is illustrated in FIG. 5 that the repair detection units 155 and 175 output four signals INV_E<0>, INV_E<1>, INV_O<0> and INV_O<1>. Each of the normal cell arrays 100 and 120 and the redundancy cell arrays 140 and 160 illustrated in FIG. 3 include eight word lines SWL0-7 or RSWL0-7. In the repair operation, the replacement is achieved in such a state that the word lines are divided based on two word lines, that is, SWL0, SWL1/SWL2, SWL3/SWL4, SWL5/SWL6, SWL7 and RSWL0, RSWL1/RSWL2, RSWL3/RSWL4, RSWL5/RSWL6, RSWL7. Thus, the number of the redundancy fuse sets corresponding to eight redundancy word lines RSWL0-7 is four. Therefore, the repair detection units 155 and 175 are to output four signals. However, a smaller number of the redundancy fuse sets and the number of the output signals of the repair detection units 155 and 175 are illustrated in FIG. 3 for illustration purposes.

As described above, when performing the repair operation of replacing the repair target word line and the adjacent word line at the same time through the efficient decoding operation for selecting the repair target address, the test operation of enabling only the word line corresponding to the cell coupled to the bit line or the bit line bar in the semiconductor memory device can be stably performed by controlling the repair target word line to correspond to the redundancy word line with respect to the same bit line or bit line bar.

While the present invention has been described with respect to the specific embodiments, it will be apparent to those skilled in the art that various changes and modifications may be made without departing from the spirit and scope of the invention as defined in the following claims.

For example, the positions and types of the logic gates and transistors set forth above may be differently implemented depending on polarities of the input signals.

What is claimed is:

1. A semiconductor memory device comprising:
   a first normal cell array comprising normal cells connected to odd word lines and bit lines and normal cells connected to even word lines and bit lines bar;
   a second normal cell array comprising normal cells connected to the odd word lines and the bit lines bar and normal cells connected to the even word lines and the bit lines;
   a first redundancy cell array comprising redundancy cells connected to the odd word lines and the bit lines and redundancy cells connected to the even word lines and the bit lines bar;
   a second redundancy cell array comprising redundancy cells connected to the odd word lines and the bit lines bar and redundancy cells connected to the even word lines and the bit lines;
   a repair detection unit configured to detect a repair operation of the second normal cell array through the first redundancy cell array or a repair operation of the first normal cell array through the second redundancy cell array; and
   a repair inversion unit configured to selectively repair the odd and even word lines of each of the first and second normal cell arrays with the odd and even word lines of the first redundancy cell array in response to an output signal of the repair detection unit when the normal cell array is selected for being repaired with the first redundancy cell array,
   wherein the repair inversion unit is further configured to selectively repair the odd and even word lines of each of the second and first normal cell arrays with the odd and even word lines of the second redundancy cell array in response to an output signal of the repair detection unit when the normal cell array is selected for being repaired with the second redundancy cell array.

2. The semiconductor memory device of claim 1, further comprising:
   a first redundancy fuse set configured to correspond to the first redundancy cell array and program a row address of a repair target word line included in the first or second normal cell array; and
   a second redundancy fuse set configured to correspond to the second redundancy cell array and program a row address of a repair target word line included in the first or second normal cell array.

3. The semiconductor memory device of claim 2, wherein the repair detection unit comprises:
   a first repair detection unit corresponding to the first redundancy cell array and configured to generate a first repair detection signal which is activated when the repair target word line is included in the second normal cell array and is deactivated when the repair target word line is included in the first normal cell array; and
   a second repair detection unit corresponding to the second redundancy cell array and configured to generate a second repair detection signal which is activated when the repair target word line is included in the first normal cell array and is deactivated when the repair target word line is included in the second normal cell array.

4. The semiconductor memory device of claim 3, wherein the repair inversion unit is configured to perform a control operation so that:
   the odd and even word lines of the second normal cell array are repaired with the even and odd word lines of the first redundancy cell array, respectively, in response to the activation of the first repair detection signal;
   the odd and even word lines of the first normal cell array are repaired with the odd and even word lines of the first redundancy cell array in response to the deactivation of the first repair detection signal;

the odd and even word lines of the first normal cell array are repaired with the even and odd word lines of the second redundancy cell array, respectively, in response to the activation of the second repair detection signal; and the odd and even word lines of the second normal cell array are repaired with the odd and even word lines of the second redundancy cell array in response to the deactivation of the second repair detection signal.

5. The semiconductor memory device of claim 1, wherein the repair detection unit comprises:

a first repair detection unit corresponding to the first redundancy cell array and configured to generate a first repair detection signal which is activated when a repair target word line is included in the second normal cell array and is deactivated when the repair target word line is included in the first normal cell array; and a second repair detection unit corresponding to the second redundancy cell array and configured to generate a second repair detection signal which is activated when the repair target word line is included in the first normal cell array and is deactivated when the repair target word line is included in the second normal cell array.

6. A semiconductor memory device comprising:

a first normal cell array comprising normal cells connected to odd word lines and bit lines and normal cells connected to even word lines and bit lines bar;

a second normal cell array comprising normal cells connected to the odd word lines and the bit lines bar and normal cells connected to the even word lines and the bit lines;

a first redundancy cell array comprising redundancy cells connected to the odd word lines and the bit lines and redundancy cells connected to the even word lines and the bit lines bar;

a second redundancy cell array comprising redundancy cells connected to the odd word lines and the bit lines bar and redundancy cells connected to the even word lines and the bit lines;

a repair operation unit configured to program a row address of a repair target word line and output a repair detection signal depending on a programmed value; and a repair inversion unit configured to selectively repair the odd and even word lines of each of the first and second normal cell arrays with the odd and even word lines of the first redundancy cell array in response to the repair detection signal when the normal cell array is selected for being repaired with the first redundancy cell array, wherein the repair inversion unit is further configured to selectively repair the odd and even word lines of each of the second and first normal cell arrays with the odd and even word lines of the second redundancy cell arrays in response to an output signal of the repair detection signal when the normal cell array is selected for being repaired with the second redundancy cell array.

7. The semiconductor memory device of claim 6, wherein the repair operation unit comprises:

a first redundancy fuse set configured to program the row address of the repair target word line corresponding to the first redundancy cell array and generate an output signal in response to an input row address; and a second redundancy fuse set configured to program the row address of the repair target word line corresponding to the second redundancy cell array and generate an output signal in response to the input row address.

8. The semiconductor memory device of claim 6, wherein the repair operation unit comprises:

a first repair detection unit corresponding to the first redundancy cell array and configured to generate a first repair detection signal which is activated when a repair target word line is included in the second normal cell array and is deactivated when the repair target word line is included in the first normal cell array; and a second repair detection unit corresponding to the second redundancy cell array and configured to generate a second repair detection signal which is activated when the repair target word line is included in the first normal cell array and is deactivated when the repair target word line is included in the second normal cell array.

* * * * *